United States Patent [19]

Grone et al.

[11] Patent Number: 4,983,966

[45] Date of Patent: Jan. 8, 1991

[54] HIGH-SPEED UNIVERSAL SCALER

[75] Inventors: Donald J. Grone, Reisterstown; Randy J. Kelsey, Hampstead, both of Md.

[73] Assignee: Westinghouse Electric Corp., Pittsburgh, Pa.

[21] Appl. No.: 470,473

[22] Filed: Jan. 26, 1990

[51] Int. Cl.⁵ ............................................. H03M 7/12
[52] U.S. Cl. .................................... 341/84; 341/99; 364/715.07
[58] Field of Search .................. 341/62, 83, 84, 85, 341/99; 364/715.03, 715.07

[56] References Cited

U.S. PATENT DOCUMENTS 3,882,483  5/1975  Burke et al. ................. 341/84
4,430,643  2/1984  Sevilla ......................... 341/85

FOREIGN PATENT DOCUMENTS 55-108049  8/1980  Japan .......................... 341/62
1086428  4/1984  U.S.S.R. ................. 364/715.07
1221757  3/1986  U.S.S.R. .................... 341/84

Primary Examiner—William M. Shoop, Jr.
Assistant Examiner—H. L. Williams
Attorney, Agent, or Firm—John K. Williamson

[57] ABSTRACT

A high-speed universal scaler operates in real time, accepting as an input an N-bit binary data word which is to be scaled (multiplied) by a scale factor specified in units per bit. The input data word is divided into M-bit sections which are provided (together with a count value indicating the position of the M-bit section within the input data word and a scale indicator value specifying which of a plurality of programmed scale factors values is to be used) sequentially as scaling addresses specifying binary coded decimal scale data in a scale memory. The sequential outputs of the scale memory in response to the scaling addresses are summed. When the sequence of addresses has been completed and all of the sequential memory outputs have been summed, the resulting sum will be a scaled binary coded decimal value equivalent to the input data word.

18 Claims, 9 Drawing Sheets

HIGH-SPEED UNIVERSAL SCALER

BACKGROUND OF THE INVENTION

The present invention relates generally to the field of real-time data scaling, and is specifically concerned with a high-speed scaler that requires relatively little hardware.

An important application of real-time data scaling is the conversion of coded digital data, representing the magnitude of a quantity or measurement, into a display decimal format which can be understood by a human operator. Such scaling operations are essential to the effective operation of radar, targeting, or fire control systems which generate coded digital signals representing the distance to a target. Because it is desirable to display an up-to-date indication of distance to the target, the coded digital signals must be scaled; that is, the numbers are converted from an unscaled digital code representing the distance to a different digital code that represents the distance in meters or feet or other units which are readily comprehensible to human operators. This information is then displayed for the operator of the distance-measuring equipment.

The time required to complete the scaling places a limit on the frequency of updates to the distance display. When an accurate real time display of distance is required, updates must be almost continuous, and the scaling circuitry must be capable of high data throughput rates. To process scaled data quickly, systems in the past have employed either a software- or a hardware-intensive architecture.

In the software-intensive approach, data is scaled by executing a multiply/accumulate/divide algorithm. The time required to execute the algorithm varies directly with the number of data bits scaled. For example, the steps required for one software-intensive scaling system operating on N bits of data are as follows:

| INSTRUCTION | CLOCK CYCLES |
| --- | --- |
| Load Scale Value | 1 |
| Load input value | 1 |
| Signed Multiply algorithm | N |
| Load Scale Value (divide) | 1 |
| Signed division algorithm | N+5 |
| Binary-BCD conversion | 2N+3 |
| Total clock cycles: | 4N+11 |

When N is large, such systems can only be made to operate at high speeds if the host processor operates at a high clock speed. As data input rates increase, this system becomes undesirable even with a high speed processor, because the processor resources must be dedicated almost entirely to the scaling operation. At very high data rates, these systems are impractical since even a high-speed processor will not provide adequate throughput.

In the hardware-intensive approach, a memory device is used for scale processing. The memory is loaded with binary scaled output values, and the input value is used to address the memory, selecting the data in the memory that is the scaled equivalent of the input. Then, binary-to-BCD conversion hardware operates on the data output from the memory to produce signals suitable for driving a display. The processing speed of such a system is the sum of access time of the memory devices used and the time required for a hardware Binary-BCD conversion. Typical conversion times are:

| N | Access Time (nS) |
| --- | --- |
| 8 | 72 |
| 16 | 252 |
| 24 | 459 |
| 32 | 612 |

This approach is extremely fast, but has several disadvantages. The hardware-intensive approach requires large amounts of memory. For exact scaling of a 16-bit word, for example, a 64K memory block is required for each scale factor used. This requirement also entails a large number of integrated circuit chips. The chip count problem is exacerbated because the Binary-BCD conversion hardware gets very large as the number of output bits increases. For example, two chips are required for N=8, eight chips for N=16, and thirty-three chips for N=32.

Neither of these approaches is entirely satisfactory. When high display update frequency is desired, the high data rates involved make software-intensive scaling impractical. Yet the alternative, a hardware-intensive scaling system, requires many integrated circuit chips which are expensive and which also add size and weight to the display system. Thus, there is a need for a scaling system that operates at high speeds, yet does not require a large chip count.

SUMMARY OF THE INVENTION

Therefore, it is a general object of the present invention to provide a novel and improved high-speed universal scaler which operates at high speeds, yet requires relatively little hardware.

It is a further object of the present invention to provide a novel and improved high-speed universal scaler which can scale input data words according to any one of a plurality of scale factors without reprogramming of the scale memory.

It is another object of the present invention to provide a novel and improved high-speed universal scaler which scales N-bit input data words by operating sequentially on M-bit portions of the input data words, where M is less than or equal to N.

Yet another object of the present invention is to provide a novel and improved high-speed universal scaler which sequentially selects M-bit portions of an N-bit input data word and uses the M-bit portions to address a scale memory which has been programmed with scale data, whereupon the sequentially selected outputs of the scale memory are summed to produce a scaled output equivalent of the input data word.

Another object of the present invention is to provide a novel and improved high-speed universal scaler which sequentially selects M-bit portions of an N-bit input data word, provides a counter value indicative of the position of the M-bit portion within the input data word, and provides a scale factor selector value indicative of the scale factor to be used on the input data word, wherein the M-bit portion, the counter value, and the scale factor selector value are used to address a scale memory which has been programmed with scale data, and wherein the sequentially selected outputs of the scale memory are summed to produce a scaled output equivalent of the input data word.

A further object of the present invention is to provide a novel and improved high-speed universal scaler which operates according to the objects described previously, wherein the scale data in the scale memory is in binary coded decimal format so that the scaled output will be in binary-coded decimal format.

Other objects of the present invention will become apparent through examination of the drawings, description, and claims herein.

These objects and others are achieved by providing a high-speed universal scaler which accepts as an input an N-bit binary data word which is to be scaled (multiplied) by a scale factor specified in units per bit. The input data word is divided into M-bit sections which are provided (together with a count value indicating the position of the M-bit section within the input data word and a scale indicator value specifying which of a plurality of programmed scale factors values is to be used) sequentially as scaling addresses specifying binary coded decimal scale data in a scale memory. The sequential outputs of the scale memory in response to the scaling addresses are summed. When the sequence of addresses has been completed and all of the sequential memory outputs have been summed, the sum will be a scaled binary coded decimal value equivalent to the input data word.

DETAILED DESCRIPTION OF A PREFERRED EMBODIMENT

Figure 1A:
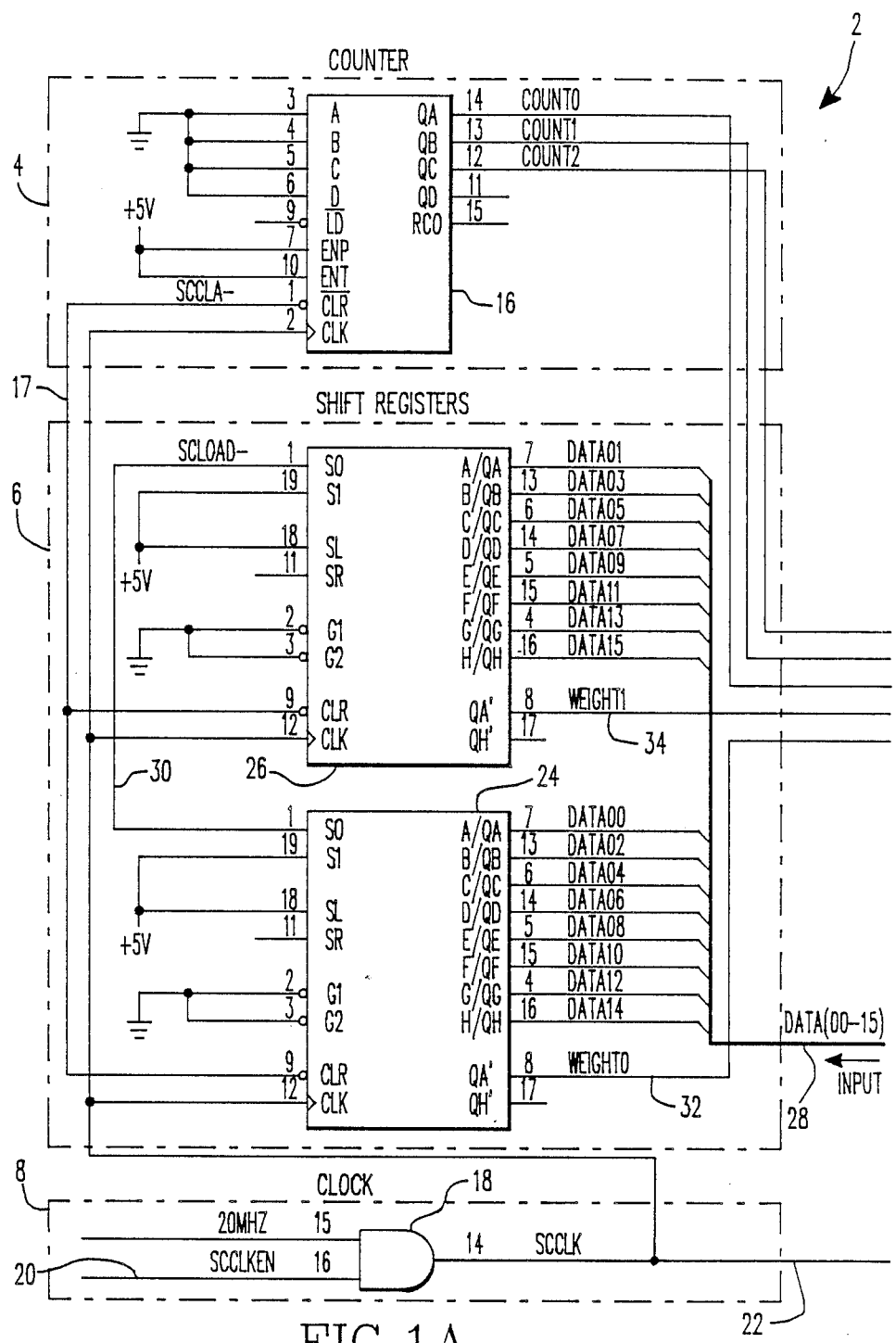
FIGS. 1A and 1B are a partial schematic diagram of the high-speed universal scaling circuit of the present invention showing the counter, shift registers, clock, and address latch sections of the circuit.

FIGS. 1A through 1H together comprise a schematic diagram of a high-speed universal scaling circuit 2. Scaling circuit 2 comprises a counter section 4, shift register section 6, clock 8, address latch section 10, and scale processor 11 (all shown in FIGS. 1A and 1B); a scale memory section 12 (shown in FIGS. 1C and 1D) which holds scale data according to one or more scale factors; and an accumulator section 14 (shown in FIGS. 1E, 1F, 1G and 1H) which sums scaled data in accumulator cycles as will be described later in more detail.

The high-speed universal scaler of the present invention will be described herein in terms of a system capable of scaling N=16 bit data words at a rate of M=2 bits per accumulator cycle, using any one of S=64 scale factors at a time. However, those skilled in the art will, based on the description and drawings herein, be able to modify the system to scale data words of any other desired size, process any desired number of bits in each accumulator cycle, and to use any desired number of scale factors.

Figure 1B:
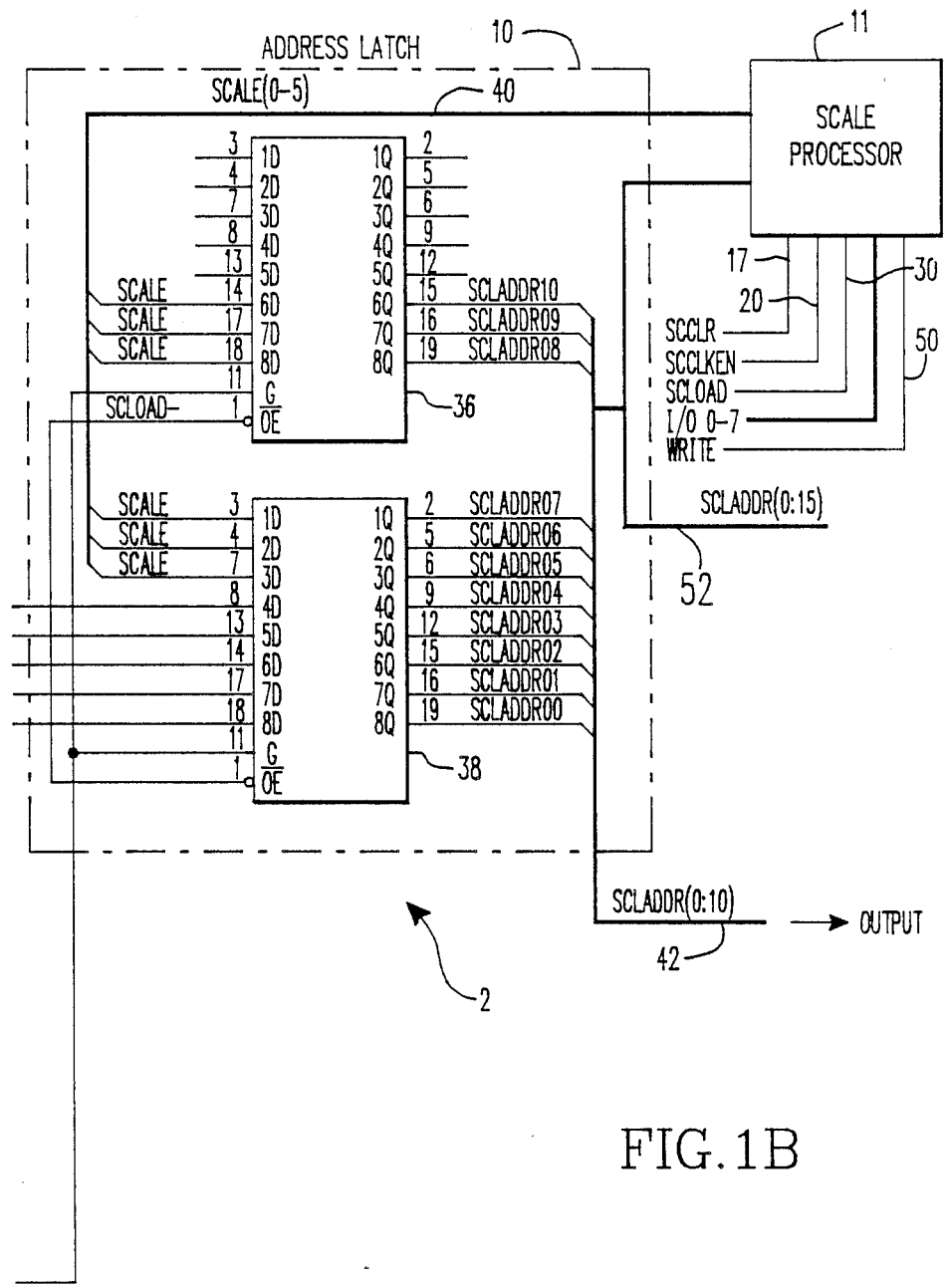

Referring now to FIGS. 1A and 1B, the counter section 4 of the scaling circuit 2 consists of a counter 16 which may be a 74AS161 integrated circuit. The 74AS161 is a synchronous modulo-16 counter, although it is used here as a modulo-8 counter (a modulo-8 counter could be substituted if desired). The counter 16 has three outputs, COUNT0, COUNT1, and COUNT2, which are inputs of the address latch section 10. The counting circuit used is well known in the art, so its operation will be described only briefly. In operation, counter 16 produces a binary numerical output on the three lines COUNT0, COUNT1, and COUNT2 that increments over time, beginning with a binary 000 and ending with a binary 111, with COUNT0 being the least significant and COUNT2 being the most significant bit of the output. Counter 16 resets and begins counting in response to a scale clear signal 17 (SCCLR) which is generated by scale processor 11 according to its program which will be described later in more detail. The timing of the output incrementation of counter 16 is controlled by a timing signal 22 from clock section 8 (SCCLK).

The outputs of counter 16 (shown here as COUNT0, COUNT1, and COUNT2) uniquely identify the M-bit section of the N-bit data word (input from data bus 28) being transferred to address latch section 10 by shift register section 6. Thus, the required capacity of the counter 16 will vary depending on the values of N (the number of input data bits) and M (the number of input data bits processed at a time) chosen for the high speed universal scaler 2. Specifically, the counter 16 must be able to count from a binary 0 to a binary value equivalent to $INT((N/M)+0.999)-1$. This requires a modulo-$INT((N/M)+0.999)$ counter. In the embodiment shown in FIG. 1A, N is 16 and M is 2, so a modulo-8 counter is required.

The clock section 8 comprises an AND gate 18 which may be part of a conventional 74AS808 integrated circuit. The inputs to AND gate 18 are a 20 Megahertz clock signal which is produced by a conventional crystal circuit (not shown), and a scale clock enable signal 20 which is generated by scale processor 11 according to its programming. The output of AND gate 18 is a scale clock signal 22 (SCCLK) which will be a 20 MHz clock signal when scale processor 11 generates an enable signal 20. When scale processor 11 is not generating enable signal 20, there will be no output at clock signal 22.

The shift register section 6 comprises, in the embodiment shown, two model 74ALS299 eight-bit shift registers denoted 24 and 26. The data input to the shift registers 24 and 26 is carried on data bus 28, which consists of N=16 data lines numbered DATA00 through DATA15, with DATA00 being the least significant bit and DATA15 being the most significant bit. The input data word transmitted on data lines DATA00 through DATA15 of data bus 28 is the data to be scaled by the high-speed universal scaler 2, this data being a binary representation of some quantity or dimension of interest. The source of this data input word may be the scale processor 11 or a circuit external to the high-speed universal scaler 2. The even data lines (i.e. DATA00, DATA02, ... DATA14) are connected in ascending order of significance to the inputs A-H respectively of shift register 24. The odd data lines (i.e. DATA01, DATA03, ... DATA15) are connected in the same manner to the inputs A-H respectively of shift register 26.

The shift registers 24 and 26 are in themselves conventional, so their operation will be described only briefly. The shift registers 24 and 26 latch in the data from data bus 28 in response to a "high" signal on scale load line 30 generated by scale processor 11 according to its program. Shift register 24 produces a weight output 32 (WEIGHT0) corresponding to the state of its least significant data input bit, data line DATA00. Shift register 26 produces a weight output 34 (WEIGHT1) corresponding to the state of its least significant data input bit, data line DATA01. Thereafter, subsequent signals from clock signal 22 (SCCLK) cause the weight outputs 32 and 34 of each of the shift registers 24 and 26 to change so that they correspond to the next most significant input bit of their respective shift register. After the shift registers 24 and 26 have serially output the states of all eight of their respective data inputs, the scale processor clears the shift registers by generating a signal on scale clear line 17 (SCCLR).

Thus, each time the clock section 8 generates a pulse on clock signal 22, the shift register section 6 transfers two single-bit weight outputs 32 and 34 from the input data bus 28 to the address latch section 10. At the first pulse from clock signal 22, the least significant bits from data bus 28 (DATA00 and DATA01) will be transferred to address latch section 10. At the second pulse from clock signal 30, the two next most significant bits (DATA02 and DATA03) are transferred to address latch section 10. This process continues until DATA14 and DATA15 have been transferred, whereupon the shifting operation is complete. Shift registers 24 and 26 are reset thereafter by scale clear signal 17 from scale processor 11.

The number of shift registers 24, 26 is chosen to correspond to the number of bits M that are to be processed in each accumulator cycle of the scaler. Further, the bit capacity of the shift registers 24 and 26 is chosen so that the desired number of bits of input data N can be transferred at one time to the shift registers; that is, the bit capacity of each shift register 24 should be greater than or equal to INT((N/M)+0.999). Other shift register configurations can be designed to correspond to other values of M and N. For example, if there were 32 data bits (N=32) and 8 data bits were to be processed in each accumulator cycle (M=8), eight shift registers could be used, with each shift register having at least four bits capacity. In this configuration, if the 32 data lines were designated DATA00 through DATA31, and the shift registers were designated WEIGHT0 through WEIGHT7 according to their outputs, they would have the following data lines as inputs (inputs listed from least significant to most significant):

| WEIGHT0 | WEIGHT1 | WEIGHT2 | WEIGHT3 |
|---|---|---|---|
| DATA00 | DATA01 | DATA02 | DATA03 |
| DATA08 | DATA09 | DATA10 | DATA11 |
| DATA16 | DATA17 | DATA18 | DATA19 |
| DATA24 | DATA25 | DATA26 | DATA27 |
| WEIGHT4 | WEIGHT5 | WEIGHT6 | WEIGHT7 |
| DATA04 | DATA05 | DATA06 | DATA07 |
| DATA12 | DATA13 | DATA14 | DATA15 |
| DATA20 | DATA21 | DATA22 | DATA23 |
| DATA28 | DATA29 | DATA30 | DATA31 |

Thus, the group of bits comprising DATA00 through DATA07 would be transferred to address latch 10 first, followed by the groups DATA08-DATA15, DATA16-DATA23, and DATA24-DATA31 in that order.

Those skilled in the art will be able to discern the pattern of input connections illustrated by the circuit diagram and this example and apply them to design an optimal shift register section 6 for any values of M and N.

Address latch section 10, in the embodiment shown, comprises two model 74AS373 data latches 36 and 38. The inputs of the latches are the weight signals 32 and 34 (WEIGHT0 and WEIGHT1), count signals COUNT0-COUNT2 from counter 16, and six scale signals generated by scale processor 11 over scale bus 40 according to the program of scale processor 11: SCALE0, SCALE1, SCALE2, SCALE3, SCALE4, and SCALE5.

The address latch section 10 operates to latch the bit components of an eleven-bit scale address bus 42 which is the output of address latch section 10. The inputs to address latch section 10, which are WEIGHT0-WEIGHT1, COUNT0-COUNT2, and SCALE0-SCALE5, are provided to address latch section 10 by shift register section 6, counter section 4, and scale processor 11 respectively, and form the bit components of scale address 42. The input signals will be generated by their respective originating sections and will arrive at address latch section 10 at slightly different times. After all the signals WEIGHT0-WEIGHT1, COUNT0-COUNT2, and SCALE0-SCALE5 are available as inputs to address latch section 10, the scale processor 11 will cause a transition in scale load signal 30 from a "high" or 1 to a "low" or 0 state. The low signal on scale load signal 30 is transmitted to the latches 36 and 38, and causes latches 36 and 38 to store the instantaneous value of the inputs WEIGHT0-WEIGHT1, COUNT0-COUNT2, and SCALE0-SCALE5 and transmit these values on the ten output lines SCLADDR00 through SCLADDR10 respectively of latches 36 and 38; these output lines SCLADDR00-SCLADDR10 comprise the scale address bus 42.

The signals over lines SCALE0-SCALE5 will determine the scaling factor used by high-speed universal scaler 2. The number of lines in scale bus 40 is determined by the number of scale factors that are to be instantly accessible during operation of the high-speed universal scaler 2. In this case, S=64 scale factors are to be available. Because 2 raised to the sixth power is 64, six bits are sufficient to select one of up to 64 scale factors. The number of bits necessary to specify one of S scale factors is given by:

SCALE BITS=log (S)/log (2).

The manner in which the scale memory address SCLADDR00-SDCLADDR10 is formulated will now be explained with particular reference to FIG. 2. In the preferred embodiment described herein, the WEIGHT0 and WEIGHT1 signal outputs of the shift register section 6, which are selected data bits from data bus 28, form the two least significant bits of the scale address bus 42, SCLADDR00 and SCLADDR01. SCLADDR02, SCLADDR03, and SCLADDR04 are formed by counter section 4 outputs COUNT0, COUNT1, and COUNT2, respectively, which indicate the positions of the data bits WEIGHT0 and WEIGHT1 within the input data bus 28. Finally, the six most significant bits of scale address bus 42, SCLADDR05, SCLADDR06, SCLADDR07, SCLADDR08, SCLADDR09, and SCLADDR10 are formed by SCALE0 through SCALE5, respectively, SCALE0-SCALE5 being the outputs of scale processor 11 on scale bus 40 which specify the scale factor used by high-speed universal scaler 2 in scaling the input data word from input data bus 28.

It will be understood that, while scale address bus 42 has eleven lines SCLADDR00-SCLADDR10 in the embodiment shown, the number of lines in scale address bus 42 will vary as a function of M, N, and S. Specifically, the number of lines required for scale address bus 42 is the total number of weight lines, count lines, and scale selection lines which is given by:

SCALE ADDRESS
BITS = $M + \text{INT}((N/M) + 0.999) + (\text{LOG } S)/(\text{LOG } 2)$.

The scale processor 11 may be any suitable microprocessor such as a 74AS5888 and may have associated with it program memory, data memory, and input/output ports which are not shown separately in the diagram. The scale processor 11 operates according to a program which may be stored in the program memory (not shown). If desired, the processor 11 can program the scale memory section 12 as will be described later in more detail prior to the initiation of scaling operations.

When an input data word is available to be scaled, the scale processor 11 will receive a signal from the source of the input data word indicating that the data word has been provided on input data bus 28. This signal will arrive by means which are well known in the art, such as an interrupt signal or a signal provided to a data input port associated with the scale processor 11. Alternatively, the source may transmit the input data word to the scale processor over the data bus I/O0-7 of the scale processor 11, and the scale processor may then retransmit the input data word to the input data bus 28 by means of a conventional data latching scheme.

As soon as the input data word is available, the scale processor 11 will actuate the scale clear line 17 to clear the shift register section 6 and counter section 4. Then, the scale processor 11 transmits a "high" or 1 signal on scale load line 30, causing the shift registers 24 and 26 to latch in the data from input data bus 28. The scale processor 11 then provides an appropriate scale selection number to address latch section 10 on scale bus 40. Then, scale processor 11 provides a scale clock enable signal 20 which actuates scale clock signal 22 and begins the scaling sequence. The scale processor 11 then enters a wait state (or performs other desired processing) during the period required to transmit the series of addresses through address latch section 10 and sum the outputs of scale memory section 12 (these operations will be explained later in more detail). When the scaling operation is complete, the scale processor 11 will turn off scale clock enable signal 20 to disable the scale clock section 8. Scale processor 11 may then signal a display or other device receiving the output of high-speed universal scaler 2 that the output is ready. Then, scale processor 11 will reset the counter section 4 and shift register section 6 by means of scale clear line 17. Scale processor 11 is then ready to scale a new input data word or performed another desired function.

Figure 1C:
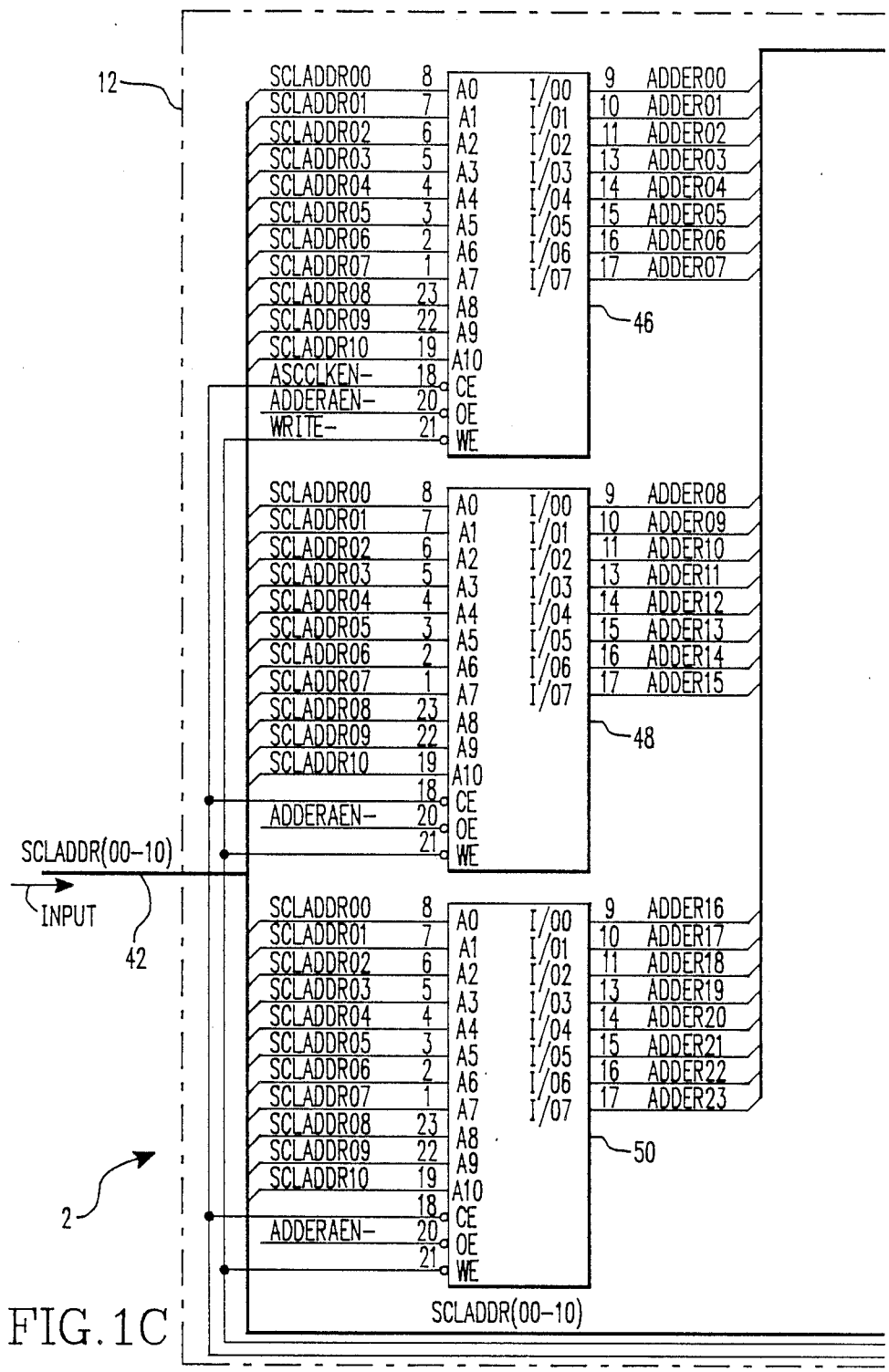
FIGS. 1C and 1D are a partial schematic diagram of the high-speed universal scaling circuit of the present invention showing the scale memory section of the circuit.
Figure 1D:
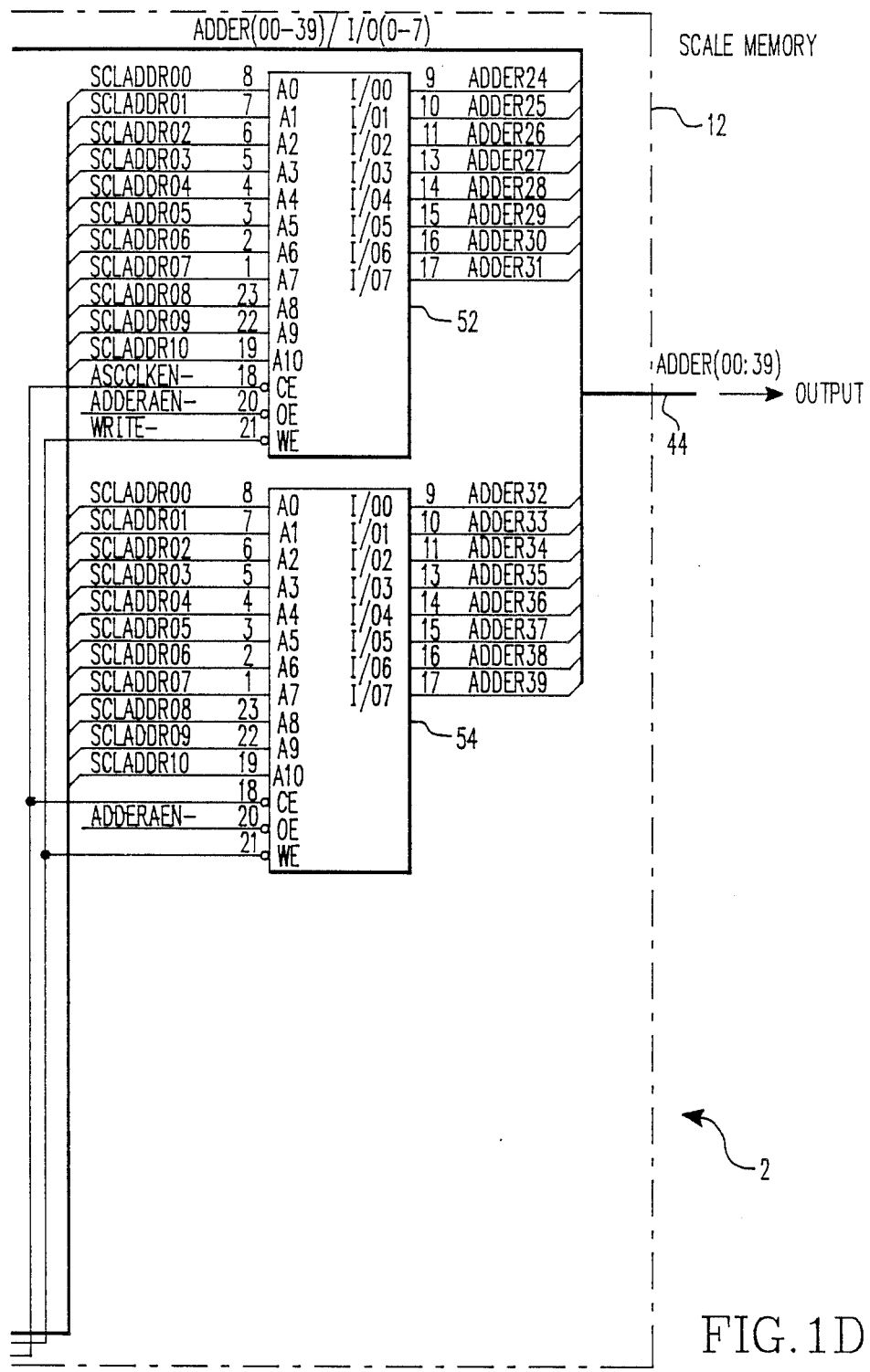
Figure 1E:
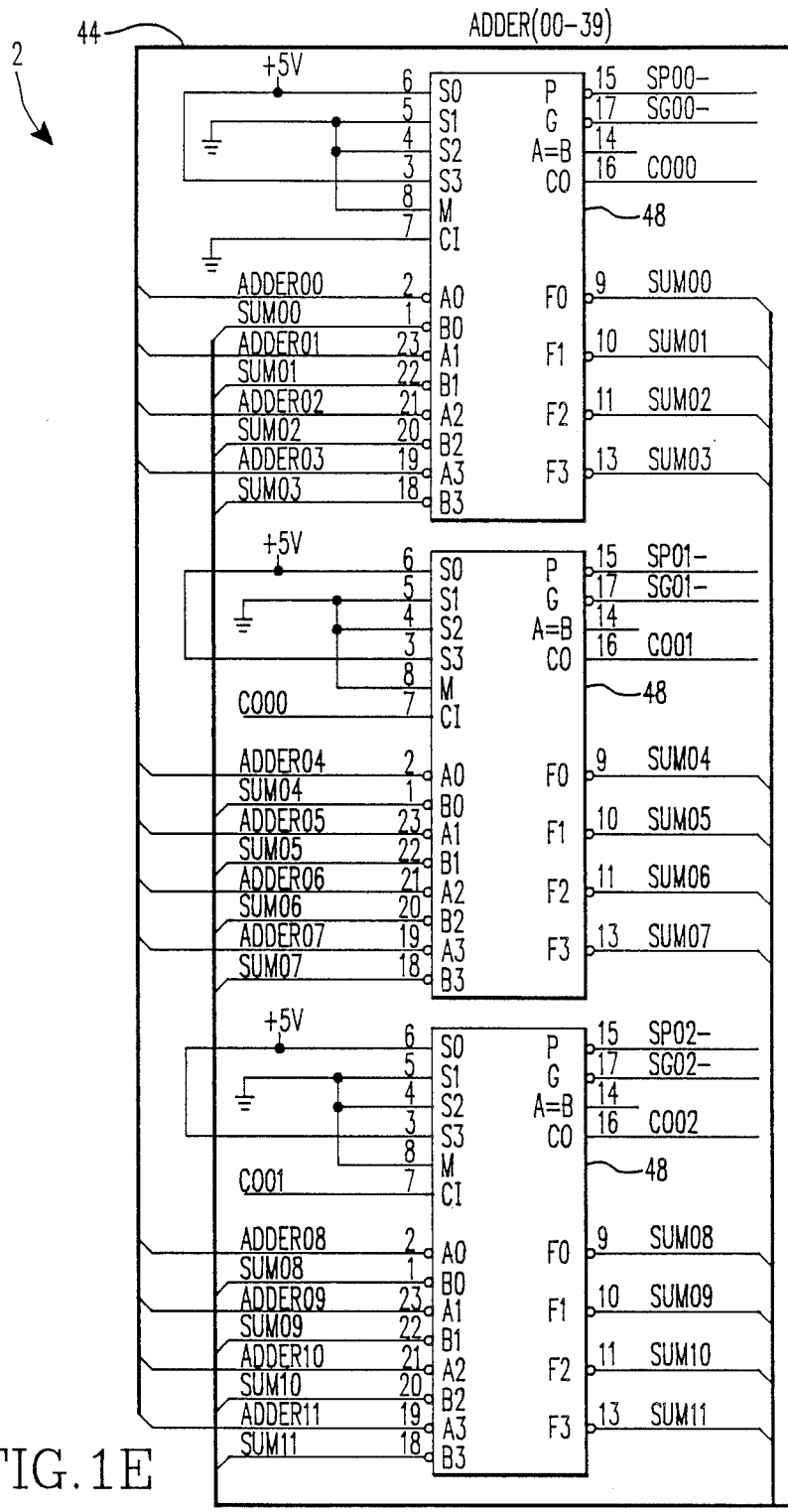
FIGS. 1E, 1F, 1G and 1H are a partial schematic diagram of the high-speed universal scaling circuit of the present invention showing the accumulator section of the circuit.
Figure 1F:
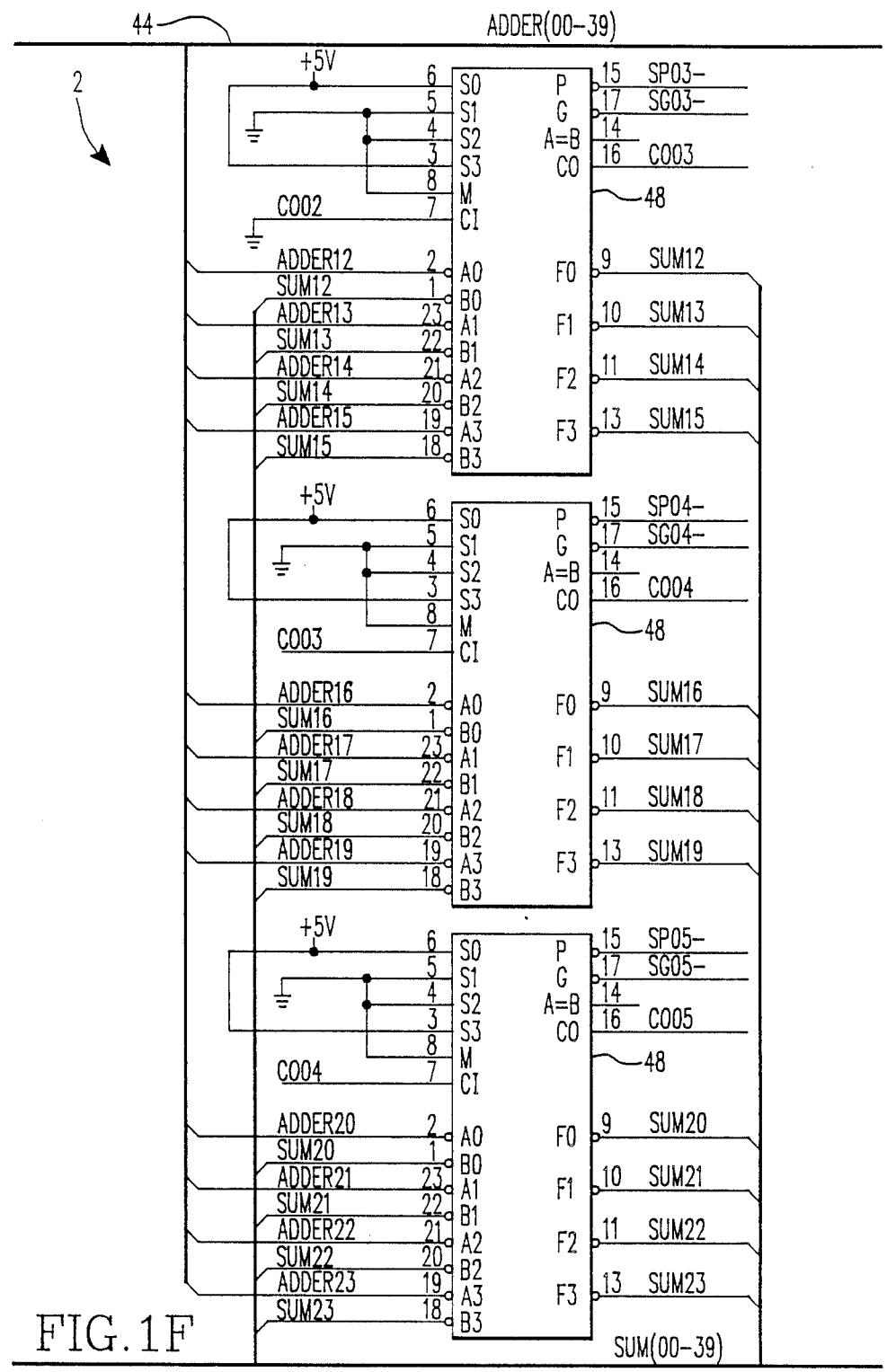
Figure 1G:
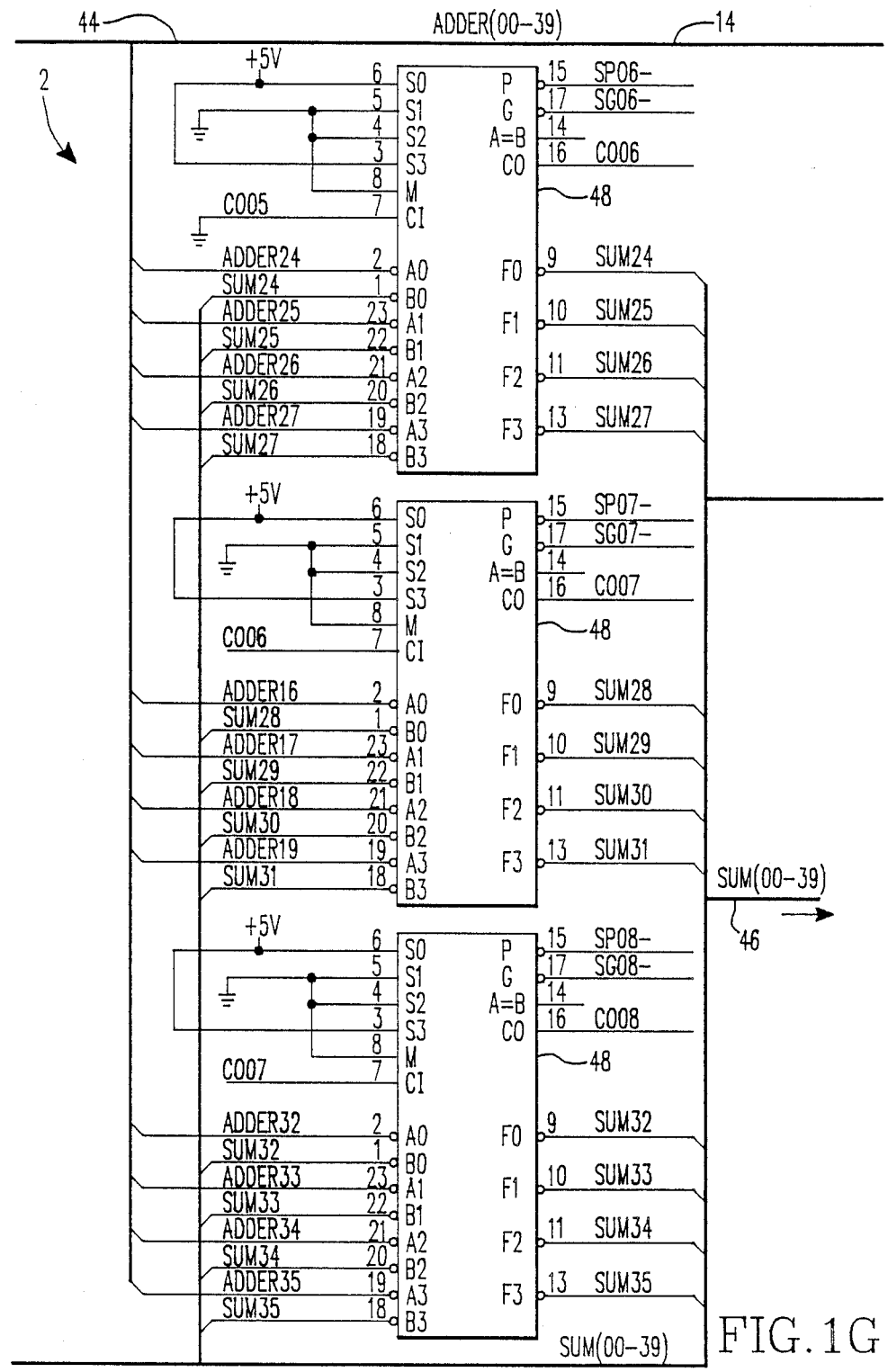
Figure 1H:
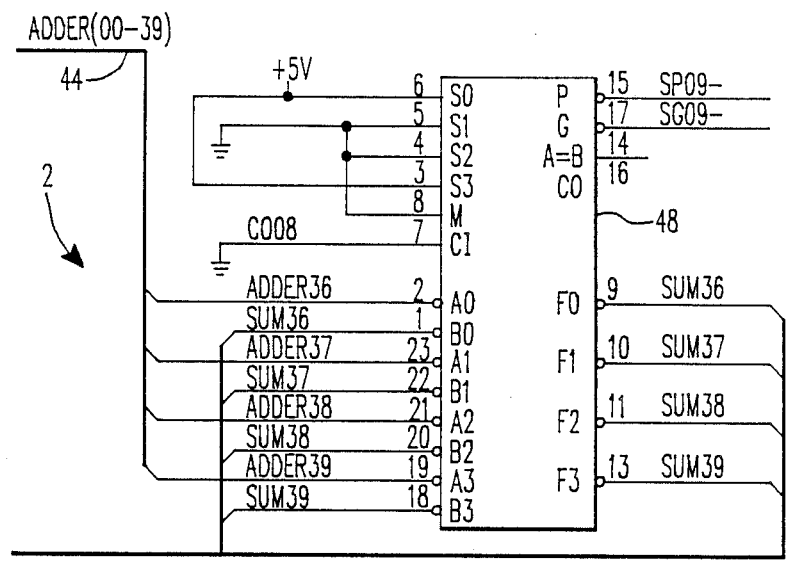

Referring now to FIGS. 1C and 1D, a scale memory section 12 is used to store scaling numbers used in high-speed universal scaler 2. The memory section 12 has as an input the scale address bus 42 and has as its output an adder bus 44 comprising forty data lines ADDER00 through ADDER39. As shown, the memory section 12 comprises five memories 46, 48, 50, 52, and 54, which may be 7C128 random access memories each having a 2,048 * 8 bit capacity. The memories 46, 48, 50, 52 and 54 each have eleven address lines A0-A10 and eight data input/output lines I/O0-I/O7. In addition, each memory 46, 48, 50, 52, and 54 is provided with three control lines: chip enable (CE), output enable (OE) and write enable (WE).

Although random access memories are used in the embodiment shown, other types of memories such as read-only memories, PROMs, EPROMs, EEPROMS, and others known in the art could be used.

The address lines A0-A10 of each memory 46, 48, 50, 52, and 54 are connected respectively to lines SCLADDR00 through SCLADDR10 of scale address bus 42. The I/O lines I/O0 through I/O7 of each memory are connected to lines I/O0 through I/O7 respectively of the scale processor 11 (shown in FIG. 1A). In addition, the I/O lines of the memories 46, 48, 50, 52 and 54 (eight each) are connected to the forty lines ADDER00 through ADDER39 of the adder bus 44 in the following manner: lines I/O0-I/O7 of memory 46 are connected to lines ADDER00 through ADDER07 respectively, lines I/O0-I/O7 of memory 48 are connected to ADDER08-ADDER15 respectively, lines I/O0-I/O7 of memory 50 are connected to ADDER16-ADDER23 respectively, lines I/O0-I/O-7 of memory 52 are connected to ADDER24-ADDER31 respectively, and lines I/O0-I/O-7 of memory 54 are connected to ADDER32-ADDER39 respectively.

The write enable (WE) input of each memory 46, 48, 50, 52, and 54 is connected to a write line 50 of scale processor 11. The scale processor 11 transmits a "low" value over this line when one of the memories 46, 48, 50, 52, or 54 is to be programmed with scale data by scale processor 11.

The chip enable (CE) and output enable (OE) lines of each memory 46, 48, 50, 52, and 54 are all connected to scale clock enable line 20 of scale processor 11 so that the memories 46, 48, 50, 52, and 54 will all be activated and will simultaneously provide output to accumulator section 14 during the scaling operation. The chip enable (CE) lines of the memories 46, 48, 50, 52, and 54 are also connected to a circuit (not shown) which selectively provides a chip enable signal over one and only one of the chip enable (CE) lines to actuate a single one of the memories 46, 48, 50, 52 or 54 when the scale processor 11 is storing scale data in the selectively actuated memory. This chip enable circuit preferably operates in response to signals on scale processor address bus 52 (shown in FIG. 1A) in the following manner. The scale address bus 42 has been described as having 11 address lines; scale processor address bus 52 includes these 11 address lines as its lower order address lines but also includes other, higher order address lines for a total of 16 address lines. The higher order address lines of address bus 52 can in the illustrated embodiment be used to directly provide chip enable signals (CE) to memories 46, 48, 50, 52, and 54 since there are five additional address lines SCLADDR11-SCLADDR15 available in the scale processor address bus 52, and five memory chips. When there are more memory chips than excess address lines available, the circuit for selectively actuating an individual memory may include a decoding device which will provide a chip enable signal to a memory when a specific bit pattern appears on the higher-order address bits of scale processor address bus 52. The means by which a decoder is used to selectively actuate memory chips as a function of higher-order address bits in the manner described is well known in the art, so that the decoder circuits are not shown here.

Thus, the scale processor 11 can directly address the scale memories 46, 48, 50, 52, and 54 to store scale data therein prior to the initiation of scaling operations. In addition, the address latch section 10 can assemble a scale address from outputs of scale processor 11, counter section 4, and shift register section 6 as described previously and transmit the scale address on scale address bus 42 to address the scale memories 46, 48, 50, 52, and 54, thus specifying a particular set of scale factor data stored in the memories. The scale factor data specified by the address on scale address bus 42 is then output by scale memory section 12 on adder bus 44.

As noted previously, the memories 46, 48, 50, 52, and 54 of scale memory section 12 are loaded with scale factor data by scale processor 11 prior to scaling operations. The data is loaded so that, during a scaling operation, the complete sequence of INT(N/M+0.999) addresses generated by address latch section 10 on scale address bus 42 will specify scale factor data which sum to the scaled equivalent value of the data word input on data input bus 28. To understand how the scale memories 46, 48, 50, 52, and 54 are programmed, Table 1 shows an example of memory contents in one block of memory, this block being sufficient to specify one of S=64 scale factors for the embodiment of the invention described herein. The example uses a scale factor of 12,249.

| SCALING MEMORY CONTENTS | | | |
|---|---|---|---|
| COUNT (DEC.) | WEIGHT (DEC.) | LSB ADDRESS (BINARY) | MEMORY CONTENTS (BCD) |
| 7 | 3 | 11111 | 0602062848 |
| 7 | 2 | 11110 | 0401375232 |
| 7 | 1 | 11101 | 0200687616 |
| 7 | 0 | 11100 | 0000000000 |
| 6 | 3 | 11011 | 0150515712 |
| 6 | 2 | 11010 | 0100343808 |
| 6 | 1 | 11001 | 0050171904 |
| 6 | 0 | 11000 | 0000000000 |
| 5 | 3 | 10111 | 0037628928 |
| 5 | 2 | 10110 | 0025085952 |
| 5 | 1 | 10101 | 0012542976 |
| 5 | 0 | 10100 | 0000000000 |
| 4 | 3 | 10011 | 0009407232 |
| 4 | 2 | 10010 | 0006271488 |
| 4 | 1 | 10001 | 0003135744 |
| 4 | 0 | 10000 | 0000000000 |
| 3 | 3 | 01111 | 0002351808 |
| 3 | 2 | 01110 | 0001567872 |
| 3 | 1 | 01101 | 0000783936 |
| 3 | 0 | 01100 | 0000000000 |
| 2 | 3 | 01011 | 0000587952 |
| 2 | 2 | 01010 | 0000391968 |
| 2 | 1 | 01001 | 0000195984 |
| 2 | 0 | 01000 | 0000000000 |
| 1 | 3 | 00111 | 0000146988 |
| 1 | 2 | 00110 | 0000097992 |
| 1 | 1 | 00101 | 0000048996 |
| 1 | 0 | 00100 | 0000000000 |
| 0 | 3 | 00011 | 0000037747 |
| 0 | 2 | 00010 | 0000024498 |
| 0 | 1 | 00001 | 0000012249 |
| 0 | 0 | 00000 | 0000000000 |

Figure 2:
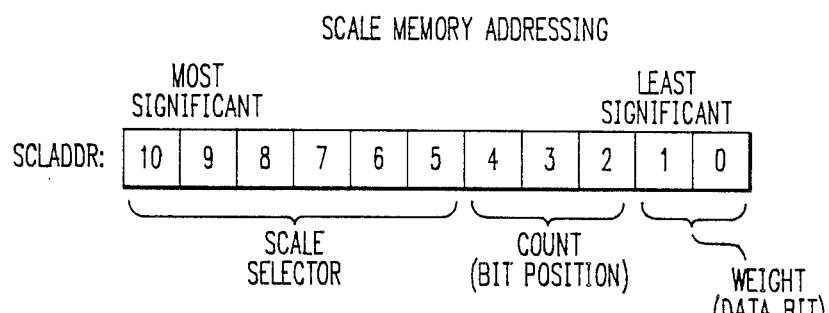
FIG. 2 is a diagram showing the composition of the scale memory address.
Figure 3:
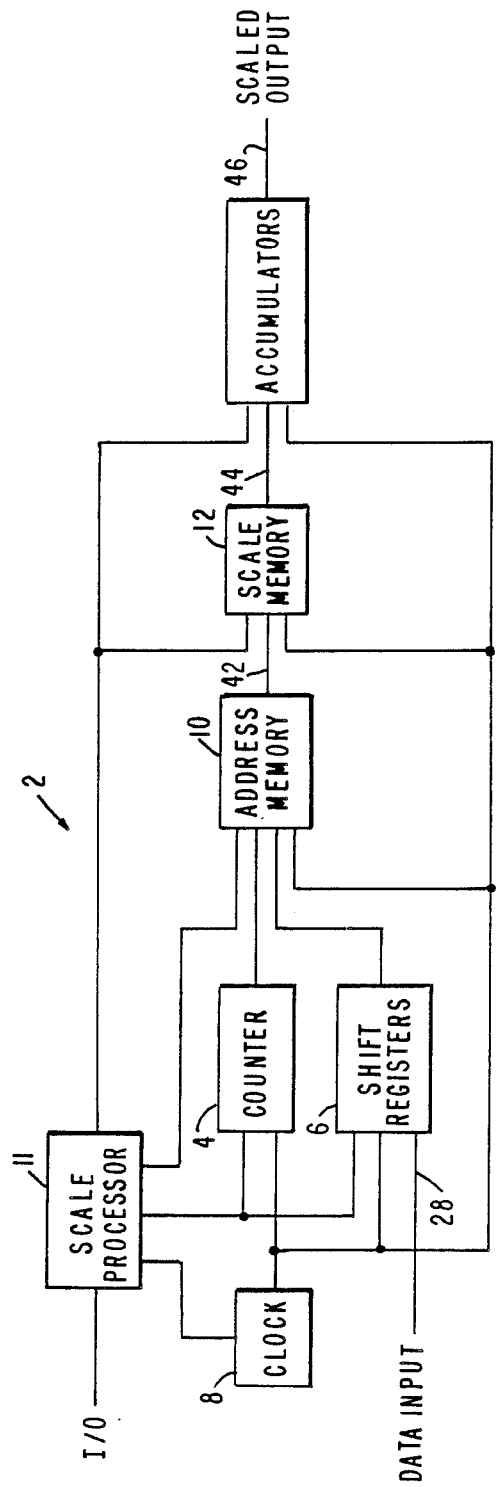
FIG. 3 is a block diagram of the circuit of FIGS. 1A through 1H.

The number of memory addresses in the block is equal to 2 raised to the power of the number of weight bits plus the number of count bits, these quantities being shown in the addressing diagram in FIG. 2. Thus, in the embodiment shown, there are 2 ^ (2+3) or 32 memory addresses in a block. There are 64 such blocks in the embodiment shown. While this block is programmed to use a scale factor of 12,249, the other blocks will preferably be programmed with data pertaining to other scale factors.

Referring now to Table 1, the first column shows the decimal value of the three count bits, which are the third, fourth and fifth least significant bits in the scale address (as shown in FIG. 2). The second column shows the decimal value of the two weight bits which are the two least significant bits of the scale address (as shown in FIG. 2). The third column shows the five least significant bits of the scale address, comprising the count and weight bits, in a binary format. All possible values of these five least significant bits are represented in the table. The six most significant bits in the scale address specify which of the 64 scale factors are to be used, i.e. which block is being addressed. Thus, the six most significant bits of the scale address will be the same for all addresses in the block. These bits are not shown in the table because the assignment of the scale selector number defined by the bits to a particular block containing data for a particular scale factor is arbitrary.

The last column of Table 1 shows the contents of the memories 46, 48, 50, 52, and 54 (shown in FIGS. 1C and 1D) in Binary Coded Decimal format. Each scale memory 46, 48, 50, 52, and 54 stores eight bits for each scale address. Each column of BCD values in the last column of the table is the decimal value of four output bits of a scale memory. Thus, each scale memory 46, 48, 50, 52, and 54 can store two of the digits in the last column of the table at the address shown. The five memories 46, 48, 50, 52, and 54 can together store, at each address, the respective ten digits shown in the last column. The digits are assigned to the five memories as follows: The rightmost two columns of BCD values represent the values stored in scale memory 46, the third and fourth rightmost columns of BCD values represent the contents of scale memory 48, the two central columns represent the contents of scale memory 50, the third and fourth leftmost columns of BCD values represent the contents of scale memory 52, and the two leftmost columns of BCD values represent the contents of scale memory 54. Thus, the memories 46, 48, 50, 52 and 54 work together as a unit to store the BCD values shown in the memory contents column of Table 1.

As described previously, the count indicates the position of the M weight bits within the N-bit data input word. The weight bits are the values of the bits in the N-bit data word at the positions indicated by the count. In the embodiment shown, M is 2, so that when COUNT=0, the two weight bits are the two least significant bits of the N-bit data input word. When COUNT=1, the weight bits are the third and fourth least significant bits of the N-bit data input word, and so on. The N-bit data word is a binary representation of a quantity which is to be scaled. For example, a distance might be represented by the data word 1101001101010110 where the distance is 12.249 feet/bit. The decimal equivalent of the data word is 54,102, and the data word (scaled by the scale factor 12.249) thus represets 662,695.398 feet.

The memory contents are determined so that a particular combination of count and weight values will address scale memory containing a portion of the total scaled value of the input data word. The portion of the scaled value is that represented by the bits in the input data word form the weight bits at the particular count value. For example, when COUNT=0, the weight bits are the two least significant bits of the data word 1101001101010110, or 10. The decimal equivalent of this binary value is 2, so that the scaled value of this data word portion is 2* 12.249 or 24.498 feet. As shown in Table 1, the memory contents are set such that, when COUNT=0 and WEIGHT=2, the output of the memory is 24498.

As a further example, when COUNT=1, the third and fourth least significant bits of data word 1101001101010110 will form the weight bits, so that the weight bits are 01. This corresponds to a decimal value of WEIGHT=1. Because the weight bits in this case occupy the third and fourth least significant bit positions, their decimal value in the data word is given by 0* 2^3+1* 2^2=4; at 12.249 feet per bit, this corresponds to 48.996 feet. Thus, the scale memories are programmed so that, when COUNT=1 and WEIGHT=1, the memory output will be 48,996.

As described previously, the scale processor 11 may store the required scale data in the memories 46, 48, 50, 52, and 54. The values to be stored can be calculated manually as shown in the examples above, or may be calculated as a function of the WEIGHT and COUNT values determining the memory address according to the formula:

$$CONTENTS(WEIGHT, COUNT) = SCALE\ FACTOR^* \ WEIGHT^* \ 2 \wedge (COUNT^* \ M)$$

Where CONTENTS is the decimal value to be stored in the memory in Binary Coded Decimal format, the scale factor is the number of units per bit expressed without a decimal point (12249 feet/bit in the example), WEIGHT is the decimal value of the weight bits in the memory address, COUNT is the decimal value of the count bits in the memory address, and M is the number of weight bits in the memory address.

In order to simplify the circuit, there is no provision for decimal point placement in the scaled result in the embodiment shown. However, a circuit operating on the output of high-speed universal scaler 2 could add a decimal point to the output display at any location desired. Thus, the scale factor of 12,249 could be used if the output was to be scaled, for example, to 12.249 units per input bit, and the decimal point could be added later.

The capacities and configurations of the scale memory section 12 comprising memories 46, 48, 50, 52, and 54 are not limited to the embodiment shown. In particular, the capacity and configuration of memory section 12 will vary depending on the values of S, N, and M, according to the formula given for calculating the number of bits in the scale address bus, because each memory component 46, 48, 50, 52, and 54 must have a byte capacity equivalent to: 2 raised to the power of the number of scale address bits. In addition, the number of memories 46, 48, 50, 52, and 54 required will vary depending on the size of the scale factors used in scaling the input data to high-speed universal scaler 2. Specifically, sufficient memories must be provided so that the number of output bits of the memories (the number of bits in adder bus 44) will be at least as large as the number of bits required for a binary representation of each digit of the largest scale factor datum to be stored in the memory. The largest datum to be stored is a function of the largest scale factor, M, and N and is determined by the following equation, where the largest scale factor does not contain a decimal point:

$$DATUM = Largest\ Scale\ Factor^* \ (2 \wedge M - 1)^* \ 2 \wedge (M^* \ (INT((N/M) + 0.999) - 1)$$

The minimum number of memory output bits required is then given by:

$$BITS\ IN\ ADDER\ BUS = LOG(DATUM)/LOG2.$$

Referring now to FIGS. 1E, 1F, 1G and 1H the accumulator section 14 produces an output which is the sum of the sequential numerical outputs of the scale memory section 12 on adder bus 44 during a cycle of counter section 4. After the counter section 4 (shown in FIGS. 1A and 1B) has completed its cycle and the entire N-bit input data word has been transmitted in M-bit units by shift registers 6 to address latch section 10, the output of accumulator section 14 is a summation of the contents of each memory contents addressed by address latch section 10 during the cycle of counter section 4. This summation output will be a binary-coded decimal representation of the scaled equivalent of the input data word.

Accumulator section 14 has as its input the adder bus 44 comprising lines ADDER00 through ADDER39, while the output of accumulator section 14 is a sum bus 46 comprising forty data lines, SUM00 through SUM39. The accumulator section 14 comprises ten four-bit adders 48 which may be 74AS881 integrated circuits. Each adder 48 has a carry input CI, two sets of four inputs, A0–A3 and B0–B3, and five output lines: one set of four outputs F0–F3, and a carry output CO. When activated, the adders 48 perform a four-bit binary addition of the binary values A0–A3 and B0–B3 respectively, producing the result at outputs F0–F3 and CO. The adders 48 are connected such that the outputs F0–F3 of each adder 48 form the inputs B0–B3 of the same adder 48, while the inputs A0–A3 of each adder 48 are connected respectively to four and only four specified lines of adder bus 44, such as ADDER00–ADDER03, ADDER04–ADDER07, etc., representing one binary coded decimal digit of the output of scale memory section 12. The carry output CO of each adder 48 is connected to the carry input CI of the next most significant adder 48 (i.e. the adder which has as its inputs the next highest numbered lines of adder bus 44).

To ensure proper accumulation of the data, a data latch (not shown) will be inserted either on adder bus 44 (between the scale memory section 12 and the accumulator section 14) or in the sum bus 46 (between the output of accumulator section 14 and the inputs of adders 48) in a manner well known in the art. The data latch will operate at the same clock rate as the shift registers 24 and 26 with an appropriate delay depending on the speed of the memories 46, 48, 50, 52 and 54. Alternatively, adders 48 might be provided with an internal latch. The latching functions just described are necessary to prevent transient signals from invalidating the data accumulated by accumulator section 14.

Thus, the adders 48 work together to maintain a running total of the scale data numbers which are transferred sequentially from the memory section 12 in response to addresses generated at address latch section 10. When the scaling cycle is completed, the final total appearing on sum bus 46 will be a BCD representation of the scaled value of the input data word. This scaled value is the final output of the high-speed universal scaler 2.

Table 2 shows as an example the accumulator output after each clock cycle, when the circuit disclosed operates on the input data word 1101001101010110 using a scale factor of 12249. The six most significant bits of the address (not shown) specify a block of memory section 12 which has been programmed according to the values given in Table 1.

TABLE 2

| COUNT VALUE (Dec.) | WEIGHT VALUE (Dec.) | ADDRESS (5 LSBs) (Binary) | MEMORY CONTENTS (BCD) | ACCUMULATOR OUTPUT VALUE (BCD) |
|---|---|---|---|---|
| 0 | 3 | 00010 | 0000024498 | 0000024498 |
| 1 | 2 | 00101 | 0000048996 | 0000073494 |
| 2 | 0 | 01001 | 0000195984 | 0000269478 |
| 3 | 3 | 01101 | 0000783936 | 0001053414 |
| 4 | 2 | 10011 | 0009407232 | 0010460646 |
| 5 | 2 | 10100 | 0000000000 | 0010460646 |
| 6 | 2 | 11001 | 0050171904 | 0060632550 |
| 7 | 1 | 11111 | 0602062848 | 0662695398 |

As the counter section 4 cycles to produce the incrementally increasing count values from 0-7 (decimal), the address latch section 10 operates in the manner described previously to generate the addresses in the third column, specifying the location of the desired memory contents as shown in the fourth column. The accumulator section 14 maintains a running total of this memory output, as shown in the fifth column. At the conclusion of the cycle of counter section 4, the output of the accumulator section 14 is a BCD representation of the scaled value of the input data word. In this case, the input data word has the decimal value 54,102. The data word has been scaled by the operations described (by a factor of 12249 feet/bit) to generate a scaled output of 662,695,398 feet.

Of course, decimal points could be read into both the scale factor and result. For example, if the scale factor were intended as 12.249 feet/bit, the result would also be read with a decimal point, to obtain a scaled value of 662,695.398 feet. The decimal point could be inserted in a display device operating in response to the scaled output of high speed universal scaler 2.

The output sum bus 46 is preferably connected to a display device which responds to binary coded decimal signals to produce a real-time data display. Alternatively, the output sum bus 46 could be connected to a data storage or other device that operates on scaled data. The scale memory section 12 could be programmed with data in a hexadecimal, octal, or other format rather than the binary-coded decimal format described depending on the input requirements of the display or storage system accepting the output of high-speed universal scaler 2.

Thus, a system has been disclosed which accepts binary input data and scales the data in real time to produce a binary-coded decimal scaled output. The number of weight bits M used in the system can be varied to achieve desired system throughput. Typical scaling times for a 16-bit data word and a scale factor of 12.249 are shown in Table 3 for the hardware-intensive and software-intensive systems described in the background section and for the high-speed universal scaler of the present invention.

TABLE 3

| SYSTEM | TIME TO OUTPUT |
|---|---|
| Software | ((4*16)+11)*90 = 6750 nsec |
| Hardware | 252 + 50 = 300 nsec |
| Universal Scaler | |
| (M=1) | 16 * 35 = 560 nsec |
| (M=2) | 9 * 35 = 315 nsec |
| (M=3) | 6 * 35 = 210 nsec |

As can be seen from Table 3, the sofware-intensive solution requires the most time to perform the operation because of the time consumed by divisions and subtractions which are not needed in the other two methods. Thus, when high speeds are required, the hardware-intensive approach or the universal scaler are preferable.

For small values of M, the hardware-intensive system operates more quickly than does the universal scaler. However, as M is increased, the universal scaler actually outperforms the hardware-intensive system. The universal scaler has another significant advantage over the hardware-intensive system in that, as N (the number of bits in the input data word) and S (the number of scale factors to be accessed) increase, fewer chips are required to construct the high-speed universal scaler than are required for a hardware-intensive method. Thus, the system of the present invention makes it possible to scale large data words, selecting from among a larger number of scale factors, and operating more quickly, while at the same time using fewer semiconductor chips.

STATEMENT OF INDUSTRIAL APPLICABILITY

The high-speed universal scaler disclosed will find its primary application in radar, tracking, or fire control systems and the like which require real-time displays of data in a scale which can be comprehended by human operators. The device disclosed can also be used in other systems which similarly require high speed scaling of input data.

We claim:

1. A circuit for the real time generation of scaled values of a series of transmitted datawords, wherein each dataword is formed from N bits formed from M bit patterns, where M in an integer equal to or less than N but greater than one, comprising:

a memory means having an address input specifying an address location, each address location being loaded with a different scaling number determined by a scaling factor, each scaling number comprising a component of a scaled value, and having an output for transmitting all of said components of each scaled value;

a latching means connected to the input of said memory means for delivering the address input to the memory means;

an accumulator means connected to the output of said memory means for adding all of said components into a scaled value for said dataword;

a shift register means connected to said latching means for accumulating datawords and transmitting the bit patterns that form said datawords to said latching means.

2. A circuit for the real time generation of scaled values as described in claim 1, further comprising a clock means connected to said shift register means for generating a series of actuating pulses that determines the rate at which said shift register means transmits bit patterns to said latching means, wherein the frequency of the actuating pulses is M times the frequency that datawords are accumulated within said shift register.

3. A circuit for the real time generation of scaled values as described in claim 2, wherein said latching means includes a counter means connected to the clock means for counting the actuating pulses generated by said clock means, and wherein the count that said counter means associates with said actuating pulse determines the address specified by said latching means.

4. A circuit for the real time generation of scaled values as described in claim 3, wherein said latching means includes a clearing means for resetting the counter means every time said counter means counts M pulses.

5. A circuit for the real time generation of scaled values as described in claim 1, wherein said memory means is a random access memory chip.

6. A circuit for the real time generation of scaled values as described in claim 5, further comprising a processor means for loading different scaling numbers of a scaling factor into different address locations of said memory means.

7. A circuit for the real time generation of scaled values as described in claim 1, wherein said memory means includes a plurality of address regions, each of which includes a plurality of address locations, and each of which is associated with a different scaling factor.

8. A circuit for the real time generation of scaled values as described in claim 7, further comprising circuit means connected to said latching means for associating each dataword with a particular address region of said memory means.

9. A circuit for the real time generation of scaled values as described in claim 8, wherein said circuit means is the bus of a computer.

10. A method for the real-time generation of scaled values of a series of transmitted datawords, wherein each dataword is formed from N bits formed in turn from M bit patterns, where M is an integer equal to or less than N but greater than one, comprising the steps of:

receiving each dataword in a data shifting device;

transmitting said series of datawords in M bit patterns from the data shifting device to a memory means having a plurality of address locations, each of which is loaded with a different scaling number determined by a scaling factor, each scaling number comprising a component of a scaled value;

directing each of said series of datawords to a selected one of said address locations in said memory means through an address input signal generated by a latching means connected to the input of said memory means, and adding all of said components into a scaled value for each of said datawords.

11. A circuit for the real-time generation of scaled values from input data words of N bits, comprising:
   a. sequential generating means for receiving the input data word and for selecting and transmitting a series of M-bit portions of the input data word;
   b. position indication generating means for transmitting a position signal indicative of the position of the M-bit portion of the input data word within said data word;
   c. scale memory means for storing scale data and for outputting specified scale data in response respectively to a series of address signals comprising said series of M-bit portions transmitted by the sequential generating means and said position signal transmitted by the position indication generating means, and
   d. summing means for summing the scale data output of the scale memory means to produce a scaled output, wherein the sum of the scale data selected from the scale memory means by said sequence of address signals is the scaled equivalent of the input data word.

12. The circuit of claim 11 further including scale factor selecting means for selecting one of a plurality of available scale factors and generating a scale factor selection number, wherein said scale factor selection number is a part of the address signal controlling the scale data output of the scale memory means.

13. The circuit of claim 12 wherein the address signal is a binary signal, and the most significant bits of the address signal represent the scale factor selection number.

14. The circuit of claim 11 wherein the scale data in the scale memory is in binary coded decimal format so that the scaled output is in binary-coded decimal format.

15. The circuit of claim 11 wherein the sequential generating means comprises at least one shift register.

16. The circuit of claim 11 wherein the scale memory means comprises at least one random access memory.

17. The circuit of claim 11 wherein the scale memory means comprises at least one read only memory.

18. The circuit of claim 11 wherein the position indication generating means is a counter which increments as the sequential generating means begins to transmit a new M-bit section of the input data word.

* * * * *